United States Patent [19]
Wong et al.

[11] Patent Number: 5,789,943
[45] Date of Patent: Aug. 4, 1998

[54] V.35 NETWORK TERMINATOR

[75] Inventors: Henry K. H. Wong, Sunnyvale; Paul S. Chan, Cupertino; Raymond W. B. Chow, Saratoga, all of Calif.

[73] Assignee: Sipex Corporation, Billerica, Mass.

[21] Appl. No.: 603,738

[22] Filed: Feb. 20, 1996

[51] Int. Cl.$^6$ .............................................. H03K 19/0175
[52] U.S. Cl. ................................. 326/82; 326/9; 326/14; 326/56; 326/86
[58] Field of Search ..................... 326/9, 14, 21, 326/82, 83–86, 90, 56–58

[56] References Cited

U.S. PATENT DOCUMENTS 5,118,970  6/1992  Olson et al. .......................... 326/9

FOREIGN PATENT DOCUMENTS 59-12625  1/1984  Japan ............................ 326/14

OTHER PUBLICATIONS

Sipex Interface Products Catalog, *SP502 Multi-Mode Serial Transceiver*, Sipex Corporation, pp. 159–171, 1994.
Y.K. Sim, et al., *Interfacing to V.35 Networks*, Linear Technology Design Notes advertisement, one page, 1994.
Micro Linear, *ML4670 Multiple Physical Interface Device*, Product information, p. 1, Jun. 1994.
Linear Technology Corporation, Figure 4. Complete Single 5V V.35 Interface, drawing, one page, 1995.

*Primary Examiner*—Jon Santamauro
*Attorney, Agent, or Firm*—Testa, Hurwitz & Thibeault, LLP

[57] ABSTRACT

A V.35 compliant driver is disclosed. The driver has three operational modes: OFF, low power (approximately ⅓ full power), and full power. The driver is placed in an appropriate mode based on conditions sensed at driver outputs. More particularly, the driver turns OFF upon sensing a short circuit condition, and reverts back to a normal operating condition following cessation of the short circuit condition by transitioning through a low power mode. Innovative approaches for satisfying V.35 source impedance measurement requirements and driver termination are also disclosed. All of the components associated with the driver reside on a single integrated circuit.

32 Claims, 16 Drawing Sheets

V.35 NETWORK TERMINATOR

FIELD OF THE INVENTION

This invention relates generally to serial transceivers, and more specifically to a CCITT V.35 compliant driver.

BACKGROUND OF THE INVENTION

Transmission of data between computers is carried out through interface devices. Most data transmission is in accordance with interface standards, such as RS232 (V.28) and RS485. As a result, interface devices are constructed to comply with particular interface standards. It is desirable for such interface devices to be small, inexpensive, and simple to employ.

One such interface standard is the V.35 standard, which originates from the International Consultive Committee for Telephone and Telegraph data transmission (CCITT). The V.35 standard includes driver specifications which must be complied with, including:

a) source impedance=50 $\Omega$ to 150 $\Omega$;

b) resistance between short-circuited terminals and ground potential equal to 150 $\Omega$+/−10%;

c) a terminal to terminal voltage equal to 0.55 V+/−20% when terminated by a 100 $\Omega$ load;

d) rise time (10% to 90%) should be less than 1% of the nominal duration of a signal element or 40 nsec, whichever is greater when terminated by a 100 $\Omega$ load; and e) the arithmetic mean of both terminals to ground potential is not to exceed 0.6 V when terminated by a 100 $\Omega$ load.

Compliance of electronic devices with interface standards such as V.35 can be certified through established processes. One such certification process is the NET2 process, established by the European Telecommunications Standard Institute. According to the NET2 process, compliance with specification b), above, is checked by measuring changes in current draw between the short-circuited terminals and ground potential when voltages of +2 V and −2 V, respectively, are applied at the terminals. More particularly, current between shorted terminals and ground is measured with +2 V applied to the shorted terminals, and a first resistance is computed therefrom. A second resistance is then computed at −2 V. Each resistance measurement must be 150 $\Omega$+/−10% for the driver to comply with the standard. This procedure is known as a "short circuit ramp test."

Compliance with the driver specifications presents difficulties in practice. As shown above, the transmitter's impedance and voltage specifications involve tight tolerances. Because the driver has a voltage output, an external resistive divider is often used to meet specification c), above. This creates a problem because the output voltage is a function of supply voltage, temperature and integrated circuit (IC) processing. Thus, compliance with the 0.55 V+/−20% terminal to terminal voltage specification and the source impedance specification pose difficulties.

V.35 interface devices, such as the ML4670 of MicroLinear Corporation and the XR-T3588/T3589 receiver/transmitter pair of EXAR Corporation, are known. However, constructing a V.35 interface with such devices entails use of multiple ICs and cumbersome external resistor networks which function as terminators for the drivers. A V.35 interface constructed with the EXAR devices, for example, includes an external resistor network and two bipolar chips at a minimum. One of the Exar chips performs a transmit function and the other performs a receive function. Further, according to the manufacturer, typical applications require three transmit and receive pairs to establish a link between distant devices.

SUMMARY OF THE INVENTION

In accordance with the present invention, a driver has three operational modes: OFF, low power, and full power, and is able to revert to the full power mode following cessation of a short circuit condition by transitioning through the low power mode. Under normal conditions, the driver operates at full power. Upon sensing a short circuit condition, the driver enters the OFF mode in which outputs are disabled. Following cessation of the short circuit condition, the driver's outputs are resistively pulled to ground. In response, logic circuitry places the driver in the low power mode, in which the driver operates at approximately one third full power. The driver thereafter reverts to the full power mode corresponding to normal operating conditions.

The logic circuitry of the present invention obviates the need for external resistor networks to comply with the V.35 interface standard. Further, the logic circuitry can be integrated with other driver circuitry to provide a V.35 compliant driver on a single integrated circuit. As a result, a V.35 interface is provided which occupies less board space, employs fewer components and which is easier to employ in practice.

BRIEF DESCRIPTION OF THE DRAWING

These and other features and advantages of the present invention will be more apparent in light of the following detailed description of the drawing in which:

FIG. 1 is a diagram of a multiple mode serial transceiver 100 in accordance with the present invention. The transceiver includes: a charge pump 102, drivers 104, receivers 106, a driver decoder 108, and a receiver decoder 110. Each driver 104 includes first and second terminals 112, 114, respectively. Output signals DRA, DRB are supplied at output terminals 112, 114, respectively. One or more of the drivers 104 may be V.35 compliant.

Figure 1:
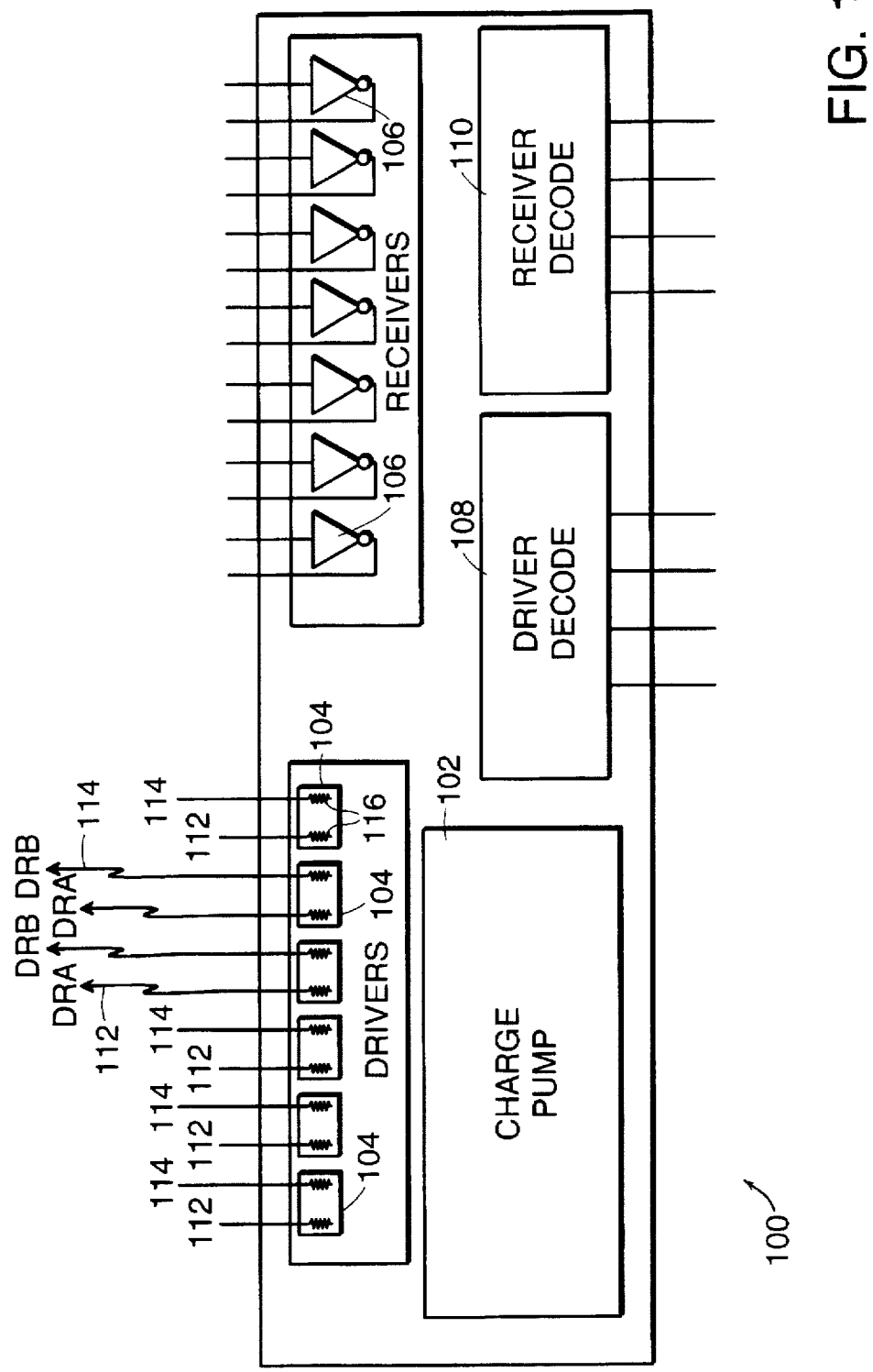
FIG. 1 is a block diagram of a serial transceiver according to the present invention.

The V.35 standard includes a specification for the drivers 104 which requires that resistance between short circuited terminals 112, 114 and ground be 150 $\Omega$+/−10%. According to the NET2 certification process, the 150 $\Omega$+/−10% specification is checked by measuring changes in current draw between the short-circuited terminals and GND when voltages of +2 V and −2 V, respectively, are applied at the terminals. More particularly, current between shorted terminals and ground is measured with +2 V applied to the shorted terminals, and a first resistance is computed therefrom. A second resistance is then computed at −2 V. Each resistance measurement must be 150 $\Omega$+/−10% for the driver to comply with the standard. This procedure is known as a "short circuit ramp test."

3

In order to comply with the short circuit ramp test each compliant driver 104 is placed in an OFF mode upon sensing the short circuit ramp condition. In the OFF mode no power is applied to the output terminals. The required 150 Ω+/− 10% resistance is then provided by polysilicon resistors 116 (poly-resistors). When driving with a 100 Ω load under normal conditions, the driver is placed in a full power mode to provide the output voltage required by the V.35 standard.

One problem associated with recovery from a short circuit condition involves the transition between the OFF and full power modes. Since no external signal is provided to the driver when the short circuit condition and normal conditions are begun or completed, the driver must be able to determine when to change modes and be able to execute such a transition. The drivers therefore include logic circuitry which place the drivers in an appropriate mode in response to the conditions sensed at the driver's outputs.

Each driver has three modes: OFF, low power (approximately ⅓ of full power), and full power. Under the control of the logic circuitry, the drivers enter the OFF mode when a short-circuit condition is sensed at the driver's outputs. To move from the OFF mode to the full power mode following cessation of a short-circuit condition, the drivers first revert to a low power mode. The low power mode provides a boot-strap to the full power mode. The following Table summarizes the logic:

TABLE 1

| Driver Outputs DRA, DRB | Driver Mode | Driver Condition |
| --- | --- | --- |
| (DRA=DRB)≠GND | OFF | short-circuit |
| (DRA=DRB=GND) | Low power | intermediate |
| DRA≠DRB | Full power | normal |

Figure 2:
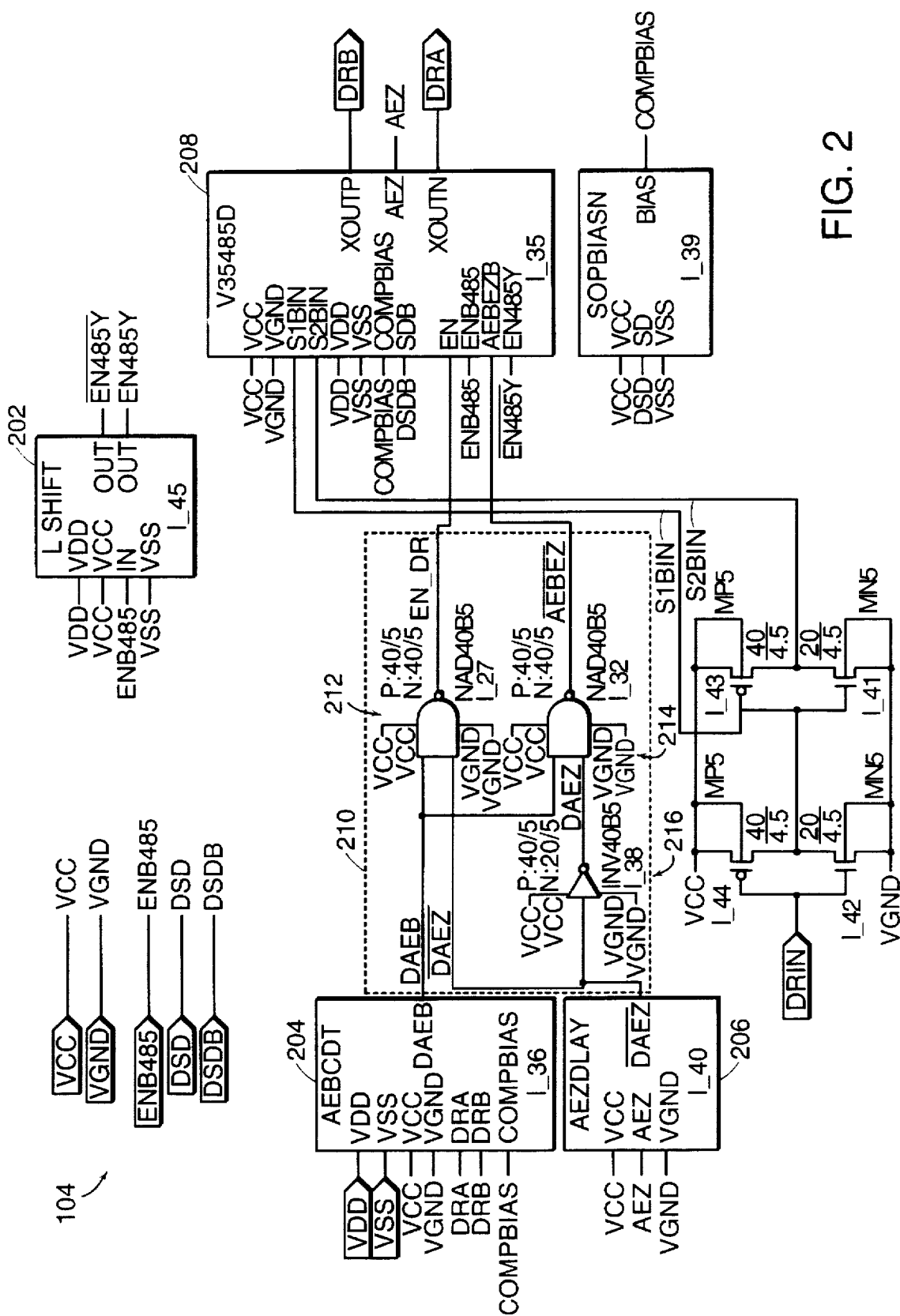
FIG. 2 is a schematic diagram of the driver of FIG. 1.

FIG. 2 is a schematic representation of one of the drivers 104 of FIG. 1. The driver includes a level shifter 202, a comparator circuit 204, a delay 206, a driving circuit 208, and a drive control circuit 210. The driver implements the logic of Table 1 based on the outputs DRA, DRB.

Controlling inputs EN and AEBEZB (corresponding to signals EN_DR and $\overline{\text{AEBEZ}}$, respectively) to the driver circuit 208 are controlled based on output signals DRA, DRB. Outputs DRA, DRB are provided by the driving circuit to the comparator circuit 204. In response to the outputs DRA, DRB, the comparator circuit provides a delayed output DAEB indicative of the condition DRA=DRB. The driving circuit 208 also provides an output signal AEZ indicative of the condition DRA=GND. The output AEZ is provided to the delay 206, which provides a delayed, inverted output $\overline{\text{DAEZ}}$, in response thereto. Both the output DAEB and the output $\overline{\text{DAEZ}}$ are provided to the drive control circuit 210. In response to the outputs DAEB and $\overline{\text{DAEZ}}$, the drive control circuit provides the enable driver signal EN_DR, and the signal $\overline{\text{AEBEZ}}$ which is indicative of the condition DRA=DRB=GND. EN_DR and $\overline{\text{AEBEZ}}$ are provided to the driving circuit 208 at inputs EN and AEBEZB, respectively.

The driver enters the OFF mode upon sensing a short-circuit condition. The short circuit condition is indicated by the EN_DR signal becoming logic 0. When a short-circuit condition is indicated by EN_DR, the driving circuit places the driver in the OFF mode. Because DRA and DRB are OFF, DRA and DRB do not affect any short-circuit ramp test being conducted. Following a short-circuit condition, the driver's outputs are no longer shorted together. However, because DRA and DRB are OFF during a short-circuit condition, DRA and DRB tend to maintain their state and thus keep EN_DR at logic 0.

The driver reverts from the OFF mode to the high power mode by transitioning through the low power mode. To return to normal operation following a short-circuit condition, the driver first senses that the short-circuit condition has ended and enters the low power mode. Upon removal of the short-circuit condition the driver 104 remains in the OFF mode for a short period of time while both outputs are resistively pulled to ground. When both outputs DRA, DRB are pulled to GND, the signal $\overline{\text{AEBEZ}}$ becomes logic 0. In response, the driving circuit 208 places the driver in the low power mode. Once the driver is in the low power mode, the driving circuit generates sufficient differential voltage at the outputs to change the state of the EN_DR signal and thus place the driver in the full power mode. Driver operation is discussed in further detail below.

Figure 3:
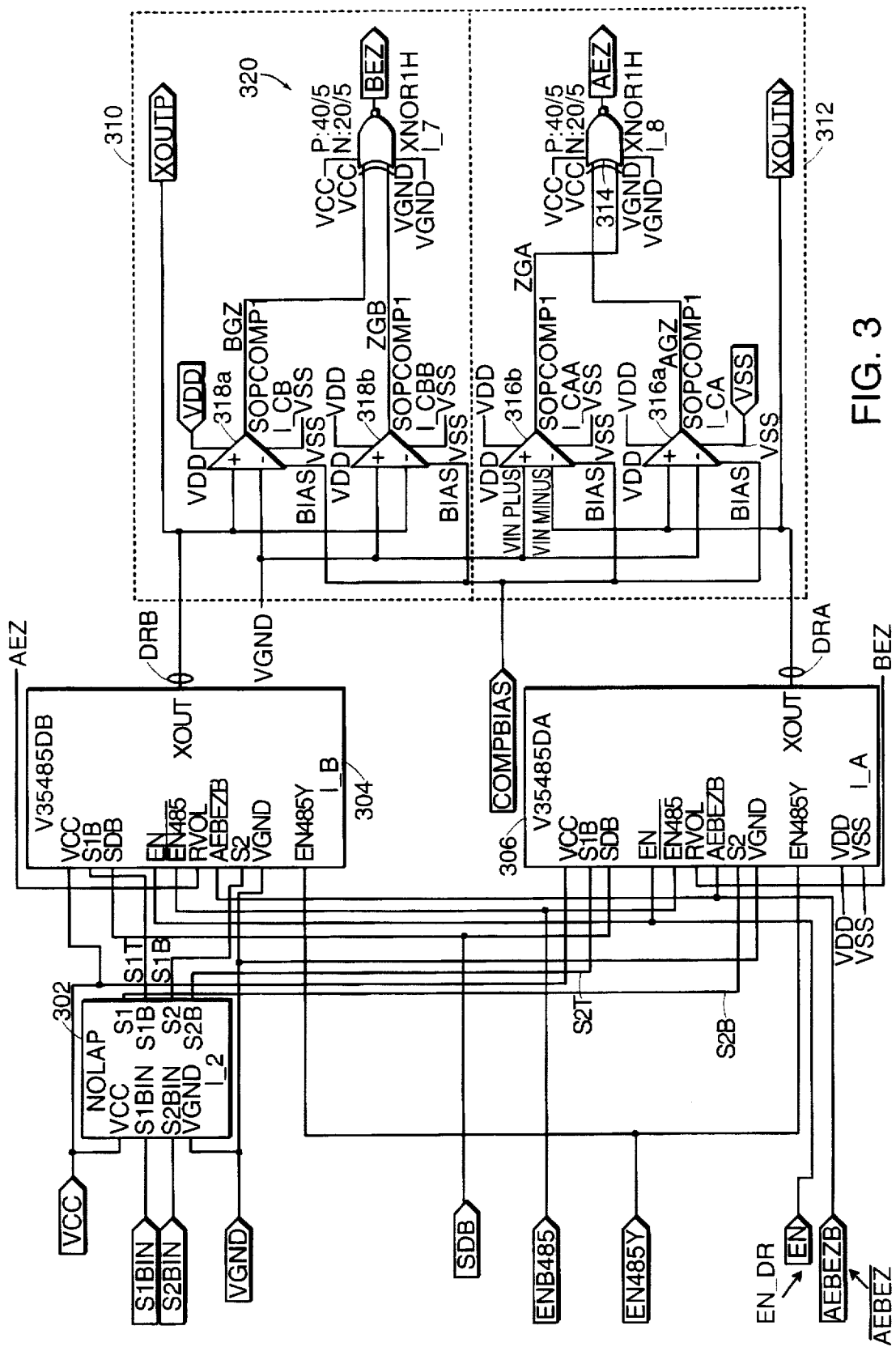
FIG. 3 is a schematic diagram of the driving circuit of FIG. 2.
Figure 4:
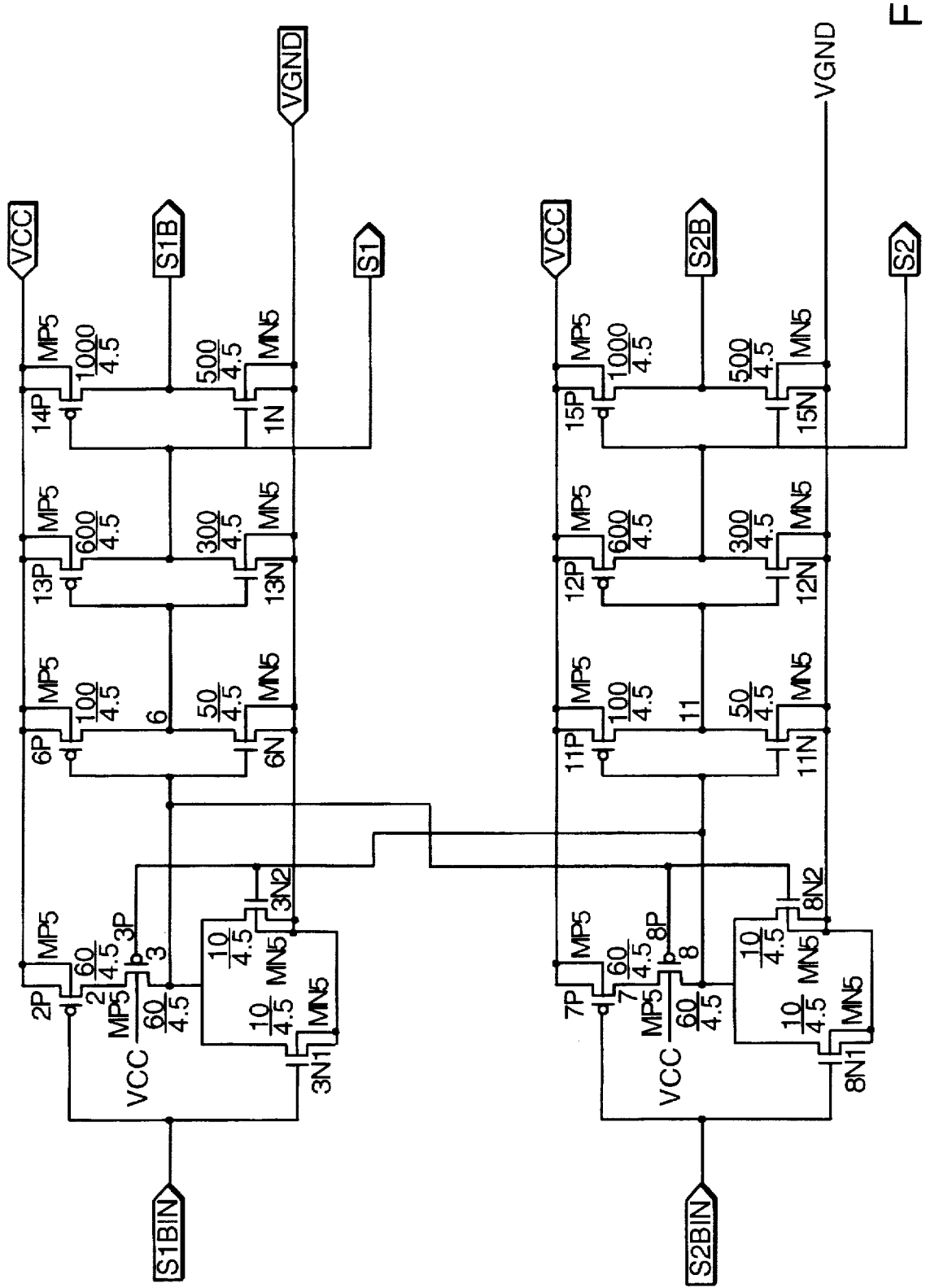
FIG. 4 is a schematic diagram of the NOLAP block of FIG. 3.

The driving circuit is shown in greater detail in FIG. 3. The driving circuit includes a NOLAP section 302 (illustrated in greater detail in FIG. 4), first and second internal driving circuits 304, 306 (illustrated with greater detail in FIG. 5 and FIG. 6, respectively), and first and second output comparison circuits 310, 312.

In order to sense the condition DRA=GND, DRA and GND are provided to comparison circuit 312. Comparison circuit 312 includes an XNOR gate 314 and two comparators 316a, 316b. The comparator circuit 312 produces an output AEZ indicative of the condition DRA=GND. DRA is provided to VINPLUS of comparator 316b and to VINMINUS of comparator 316a. GND is provided to VINPLUS of comparator 316b, and to VINMINUS of comparator 316a. Comparator 316a functions to provide a logic 1 output AGZ when DRA is greater than GND, and to provide a logic 0 output AGZ when GND is greater than or equal to DRA. Comparator 316b functions to provide a logic 0 output ZGA when DRA is greater than or equal to GND, and to provide a logic 1 output ZGA when GND is greater than DRA. Comparator 316a thus has an output which indicates with a logic 1 when ground is greater than DRA, and comparator 316b has an output which indicates with a logic 1 when DRA is greater than GND. The outputs of the comparators 316a, 316b are provided to the XNOR 314 gate. In normal operation, the two outputs 316a, 316b are different, and the output of the XNOR (AEZ) is a logic 0. However, as DRA approaches GND, the outputs of the comparators 316a, 316b become the same (logic 0), and AEZ becomes logic 1. The output AEZ is thus indicative of the condition DRA=GND.

Figure 7:
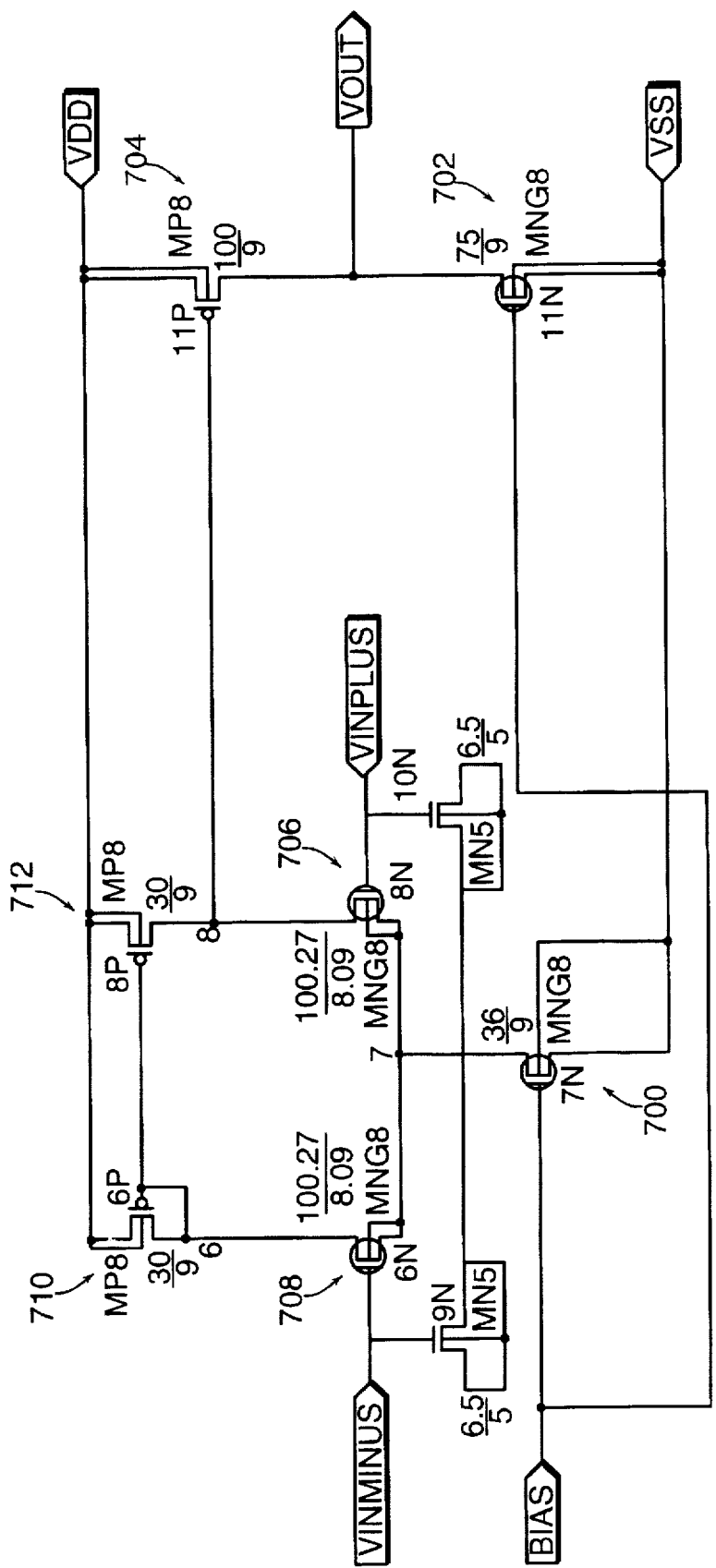
FIGS. 7 through 25 are schematic diagrams of components of the driver of FIG. 1.

The comparator 316a, 316b is shown in greater detail in FIG. 7. A BIAS signal is applied to keep FET 700 and FET 702 conductive. FET 704 is capable of sourcing greater current than FET 702. VOUT is therefore a logic 0 when FET 704 is non-conductive, and a logic 1 when FET 704 is conductive. The comparator is balanced such that either FET 706 or FET 708 is conductive depending on the inputs VINMINUS and VINPLUS, unless both inputs are at GND. More particularly, when VINPLUS is greater than VINMINUS then FET 706 is conductive and FET 708 is non-conductive, and when VINMINUS is greater than VINPLUS then FET 706 is non-conductive and FET 708 is conductive. When FET 708 is non-conductive and FET 706 is conductive, node 8 is pulled down, activating FET 708 and VOUT is driven to VDD. When FET 708 is conductive and FET 706 is non-conductive, node 6 is pulled down, and FET 710 and FET 712 are activated, deactivating FET 708 and driving VOUT to VSS through FET 702. When VINPLUS and VINMINUS are both at GND, FET 704 and FET 706 are both non-conductive, and VOUT is driven to VSS through FET 702. As shown in FIG. 3, comparison circuit 310 functions in a substantially similar manner to comparison circuit 312 in order to provide an output BEZ indicative of the condition DRB=GND. The comparison circuit 310 includes comparators 318a, 318b and an XNOR gate 320, which are configured in the same manner as comparison circuit 312, except that output DRB is used in place of output DRA.

Figure 8:
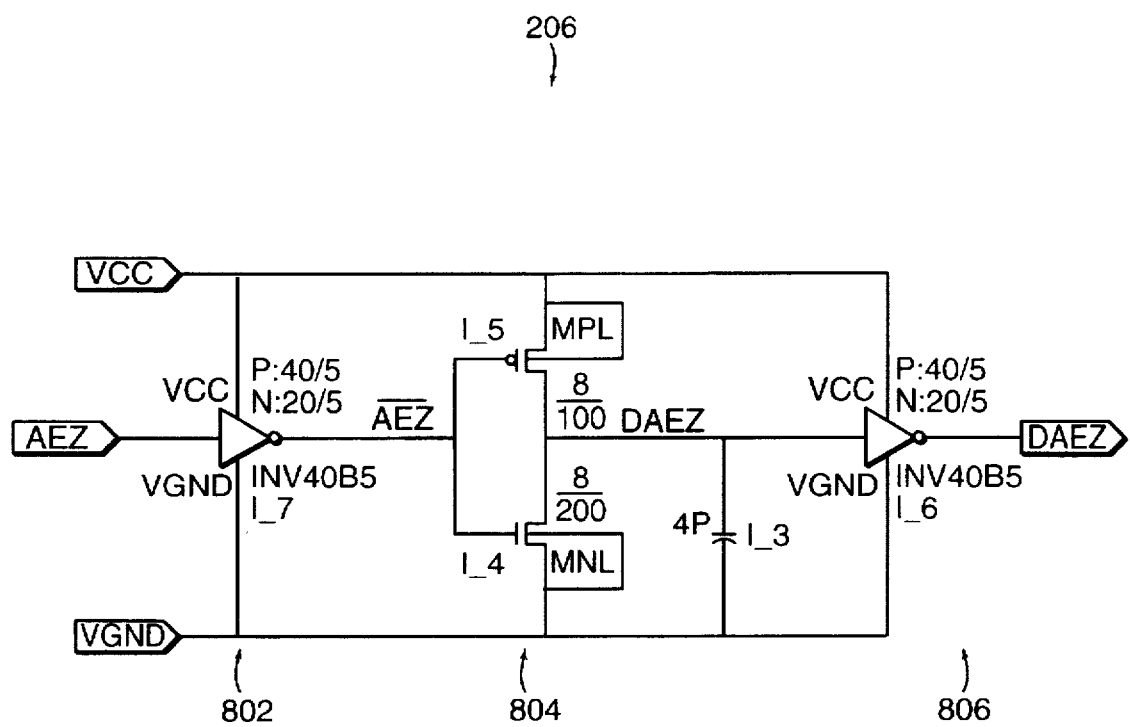

Turning briefly to FIG. 8, the output AEZ is provided to the delay circuit 206. The delay includes three inverters 802, 804, 806, and provides a delayed, inverted output $\overline{DAEZ}$ to the drive control circuit.

Figure 9:
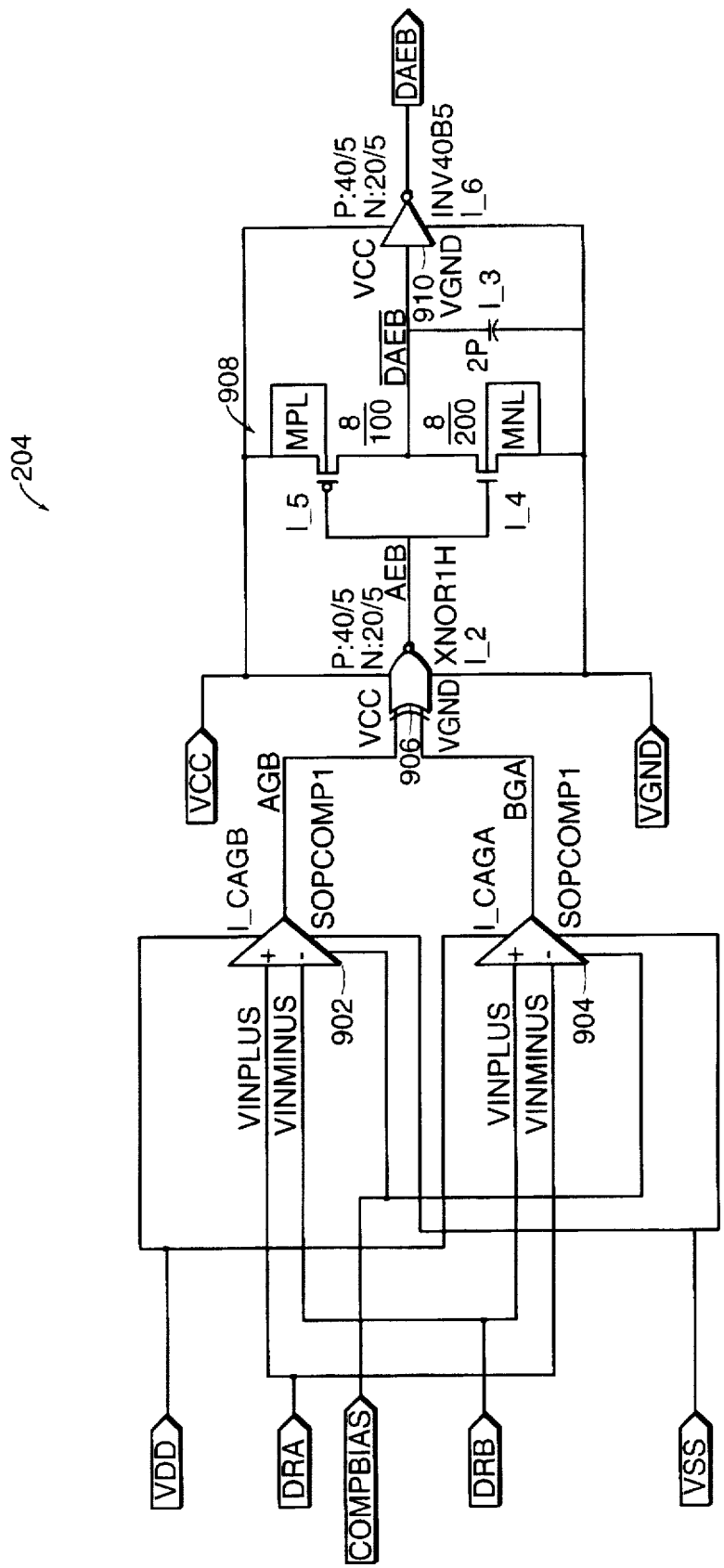
Figure 10:
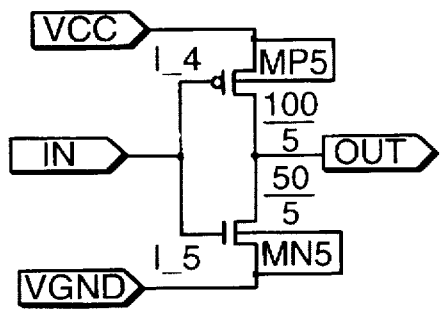
Figure 11:
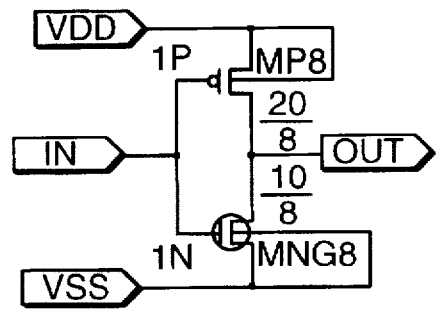
Figure 12:
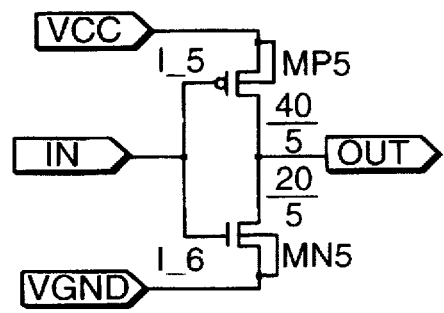
Figure 13:
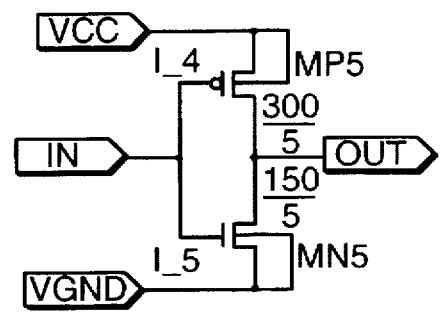
Figure 14:
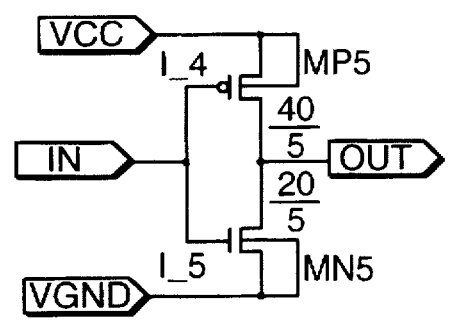
Figure 15:
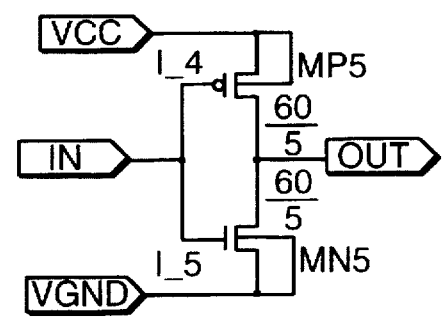
Figure 16:
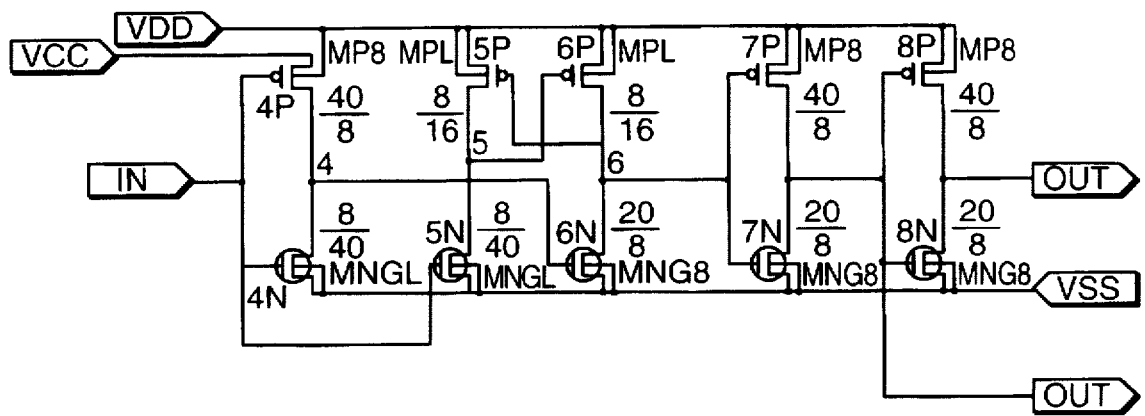
Figure 17:
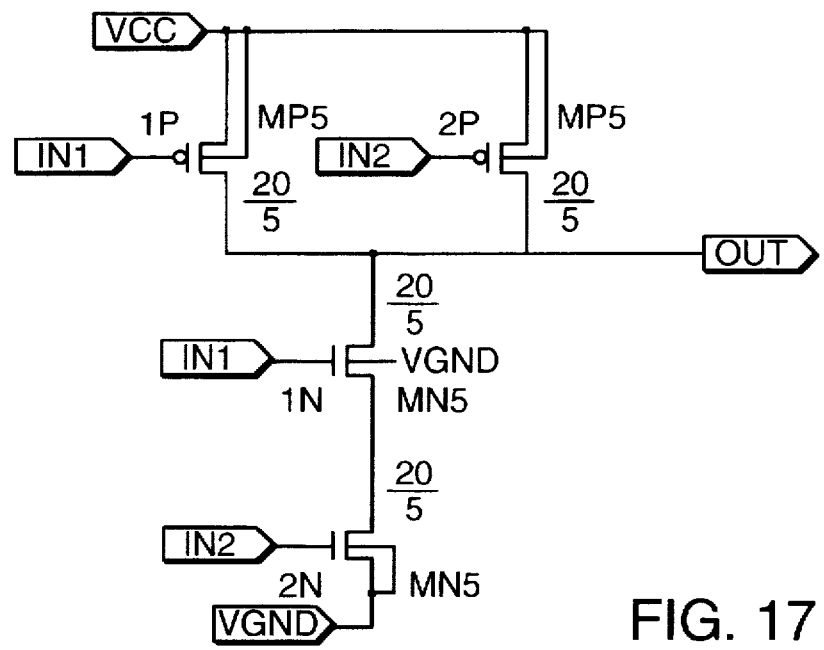
Figure 18:
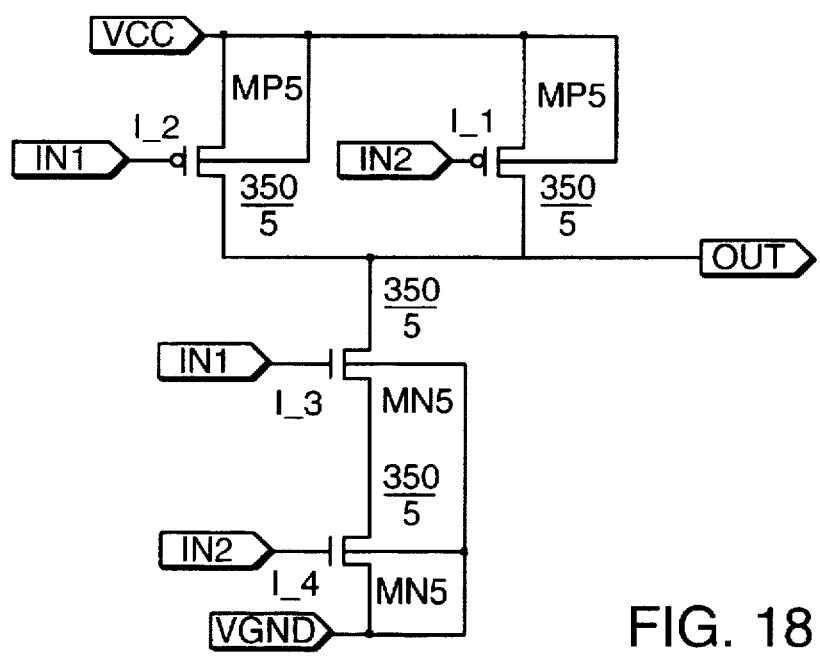
Figure 19:
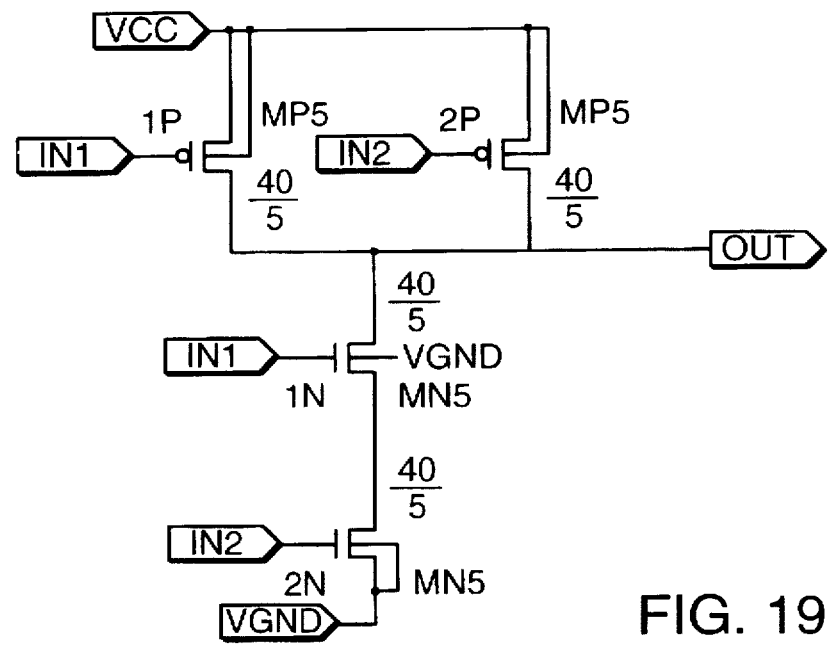
Figure 20:
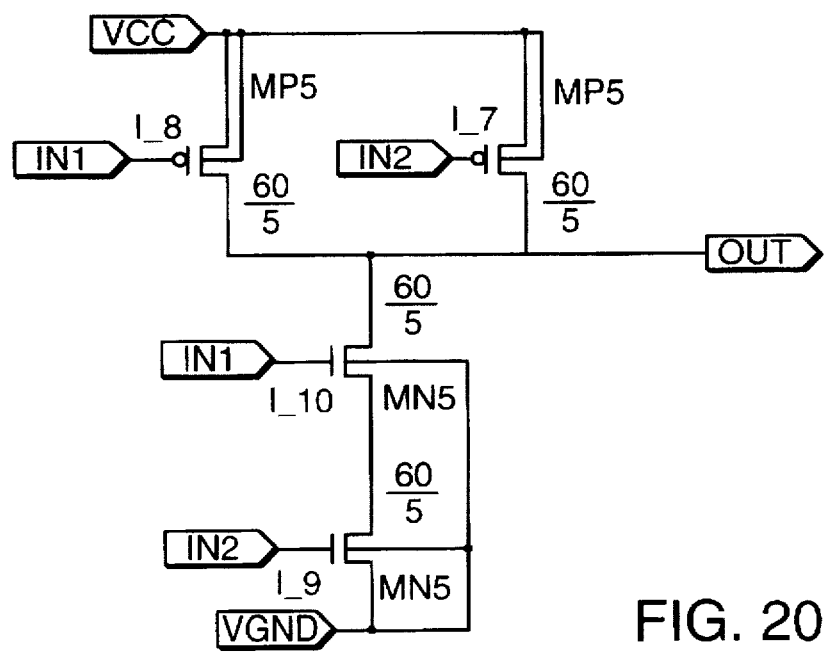
Figure 21:
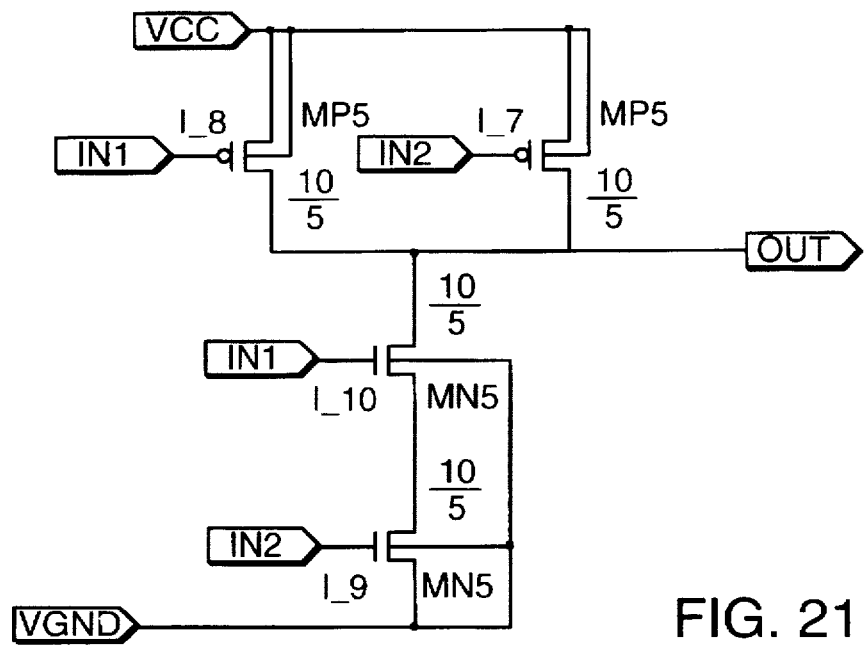
Figure 22:
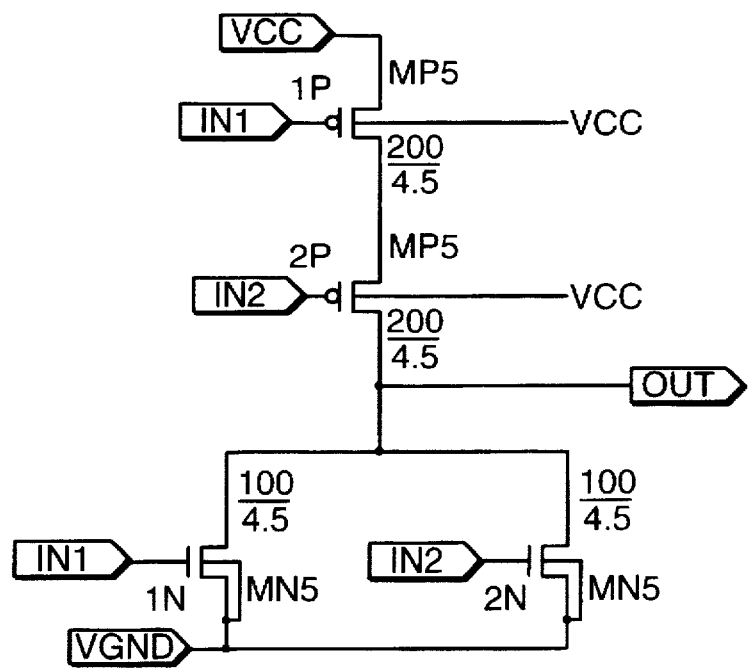
Figure 23:
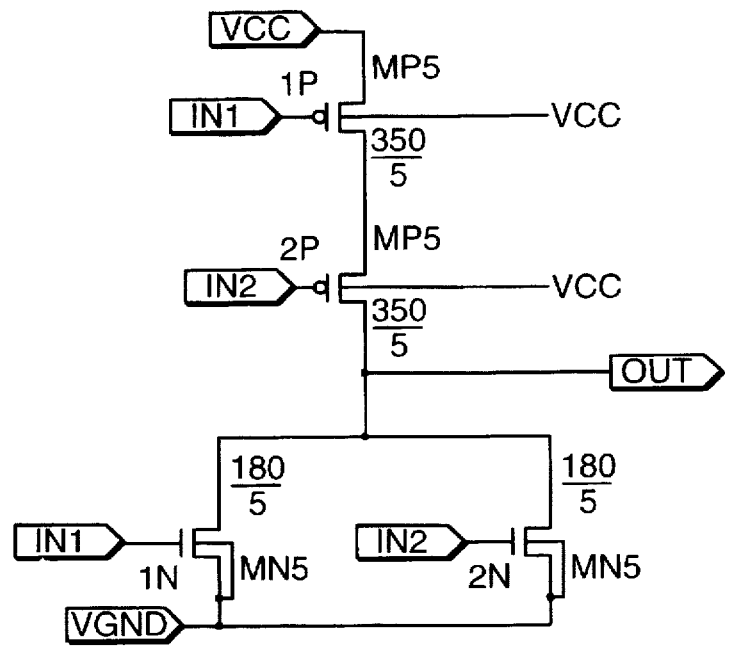
Figure 24:
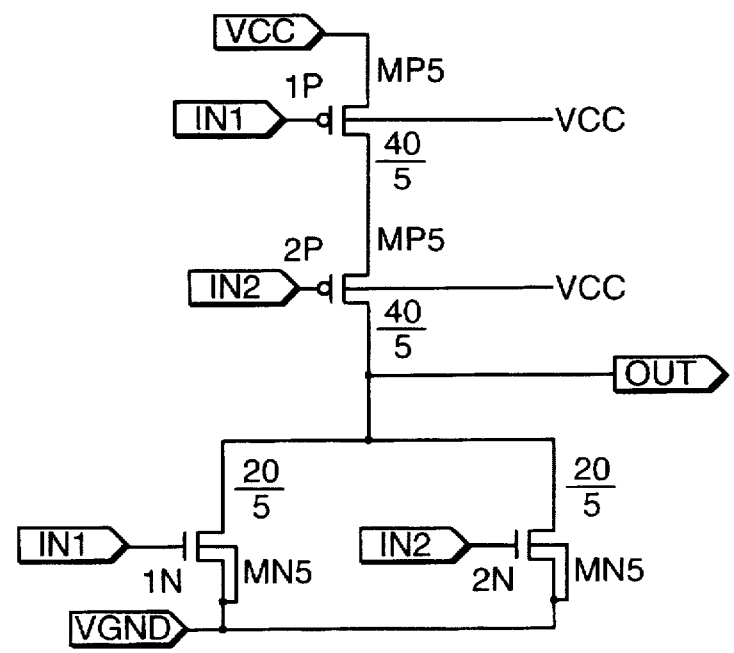
Figure 25:
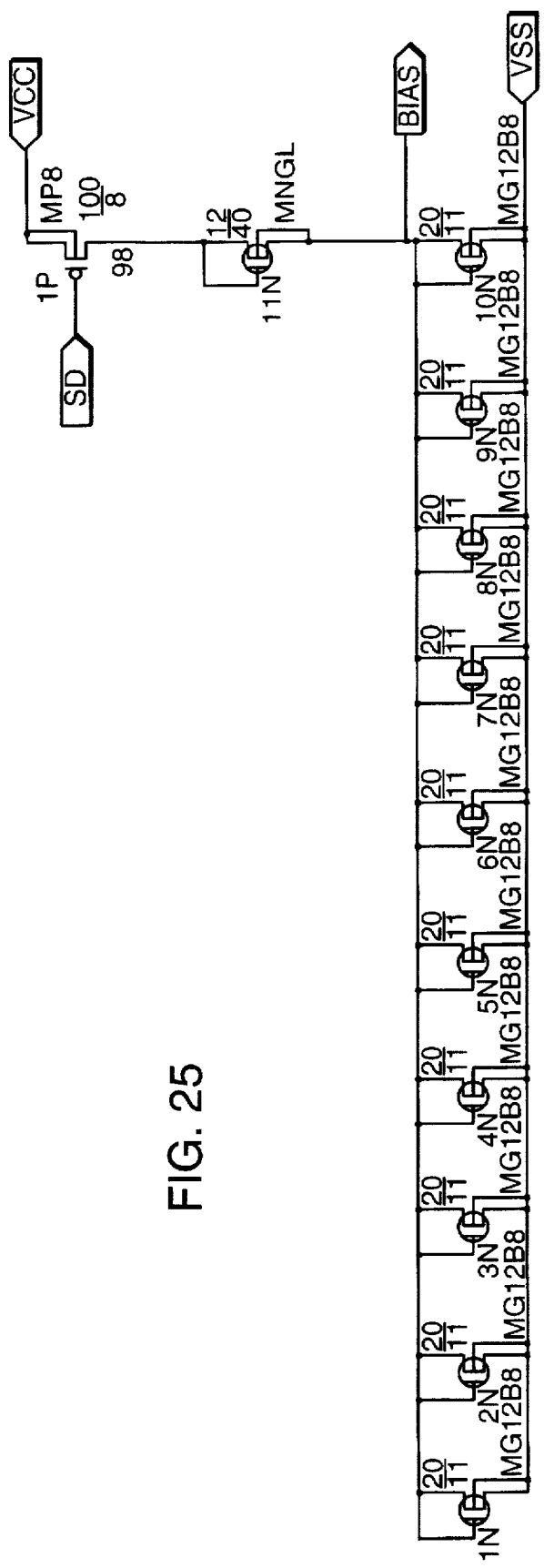

FIG. 9 illustrates the comparator circuit 204. The comparator circuit functions in response to DRA and DRB to provide a signal DAEB indicative of the condition DRA=DRB. The comparator circuit includes two comparators 902, 904, an XNOR gate 906, and two inverters 908, 910. Each comparator (illustrated in greater detail in FIG. 7) includes two inputs VINPLUS, VINMINUS, and an output which is indicative of whether the input at VINMINUS is greater than or equal to the input at VINPLUS. DRA is provided to VINPLUS of comparator 902, and to VINMINUS of comparator 904. Similarly, DRB is provided to VINPLUS of comparator 904, and to VINMINUS of comparator 902. Comparator 902 thus provides an output AGB indicative of DRA being greater than DRB, and comparator 904 provides an output BGA indicative of DRB being greater than DRA. Both outputs AGB, BGA are provided to the XNOR gate 906, which thus provides an output (AEB) indicative of whether DRA=DRB. AEB is provided to the inverters, which are arranged in series, to provide a delayed, inverted output $\overline{DAEB}$. $\overline{DAEB}$ is then provided to the drive control circuit.

Referring again to FIG. 2, the drive control circuit 210 functions in response to DAEB and $\overline{DAEZ}$ to provide EN_DR and $\overline{AEBEZ}$. The drive control circuit includes a first NAND gate 212, a second NAND gate 214 and an inverter 216. The DAEB signal and the $\overline{DAEZ}$ signal are each provided to the first NAND gate 212, and an inverted $\overline{DAEZ}$ signal (DAEZ) is provided to the second NAND gate 214 along with DAEB. The first NAND gate provides the output EN_DR, which is indicative that DRA=DRB≠GND. When the condition is true, EN_DR is logic 0. The desired response of the driver to EN_DR at logic 0 (OFF mode) is provided by inputting EN_DR to the driver enable input EN, in response to which the driver moves between the full power and OFF modes. The second NAND gate 214 provides an output $\overline{AEBEZ}$ indicative of the condition DRA=DRB=GND. The output $\overline{AEBEZ}$ is provided to the driving circuit 208. The desired response to $\overline{AEBEZ}$ being at logic 0 (low power mode) is provided by circuitry in the driving circuit.

Figure 5:
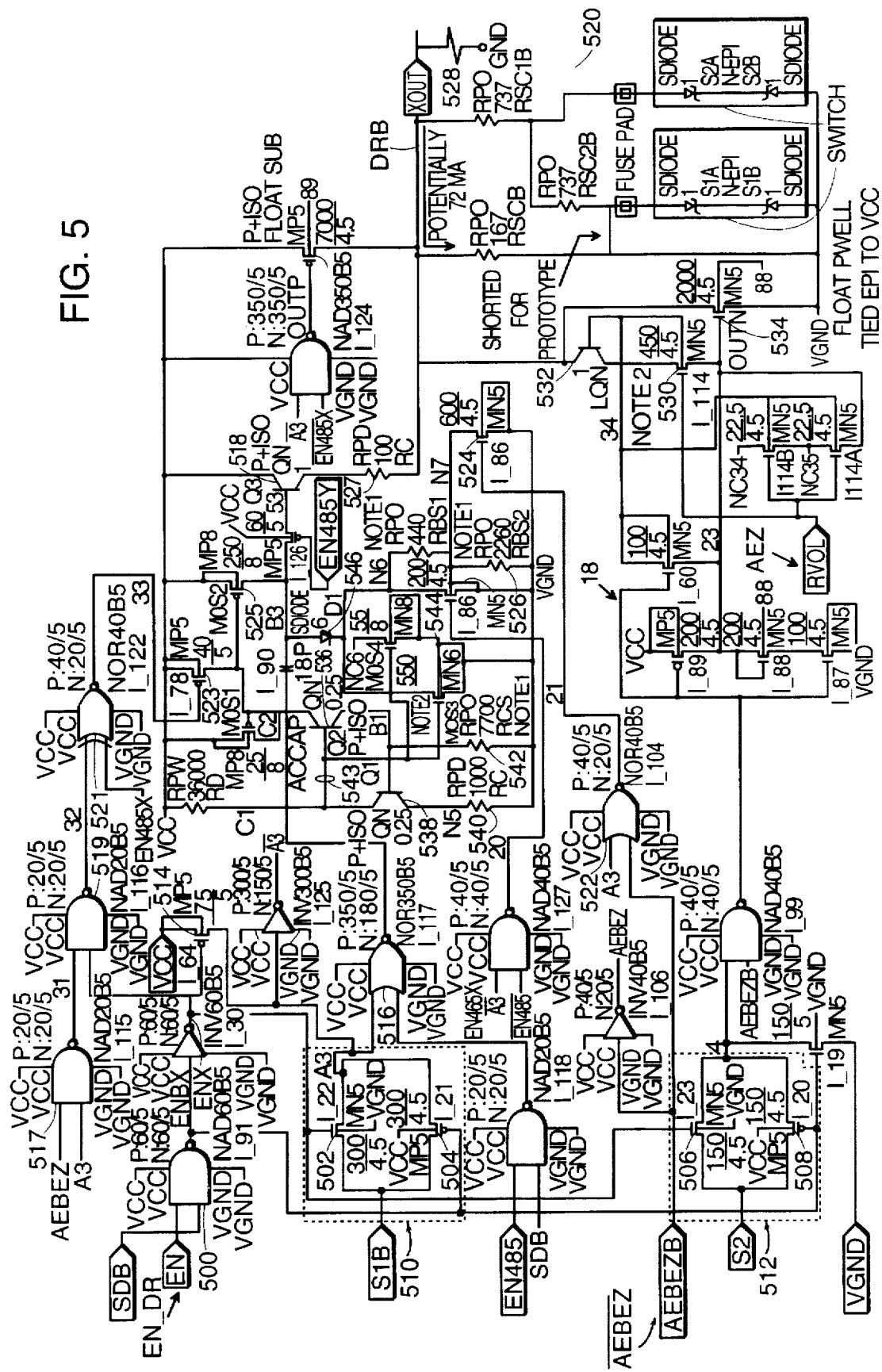
FIGS. 5 & 6 are schematic diagrams of the internal driving circuits of FIG. 4.

Referring to FIG. 5, the driver enters the OFF mode when the condition DRA=DRB≠GND is met. The EN_DR signal is provided to a NAND gate 500, which provides an output ENBX. ENBX and its inverted counterpart ENX control the gates of FETs 502, 504, 506, 508, and thus control transmission gates 510 and 512. In the full power mode, ENBX is at logic 0. When EN_DR becomes logic 0 in response to DRA=DRB≠GND, ENBX becomes logic 1 and the transmission gates are disabled since FETs 502, 504, 506, 508 are non-conductive. Further, ENX is connected to the gate of FET 514. When ENX becomes logic 0, the output of NAND 519 becomes logic 1, the output of NOR 521 becomes logic 0, and FET 523 becomes conductive and causes FET 525 to become non-conductive, cutting off bipolar transistor 518. Cutting off bipolar transistor 518 (and its counterpart 618) places the driver in the OFF mode.

When the outputs 112, 114 (FIG. 1) are no longer shorted, the driver first reverts to the low power mode and then to the full power mode. Following the OFF mode, the outputs DRA, DRB are pulled to GND by one or more poly-resistors 520 which are connected between DRB and GND. Poly-resistors exhibit the desirable quality of being relatively stable over the temperature range of the V.35 specification. The poly-resistors have a total output to GND impedance equal to 300 Ω. When the outputs 112, 114 (FIG. 1) are pulled to GND, the signal $\overline{AEBEZ}$ (FIG. 2) becomes logic 0, AEBEZ goes to logic 1 and EN_DR goes to logic 1. This $\overline{AEBEZ}$ signal is provided to NOR 522, causing FET 524 to be activated. AEBEZ is also provided to NAND 517, the output of which is provided to NAND 519, the output of which in turn changes the output of NOR 521, deactivating FET 523 and activating FET 525. Activating FET 524 effectively shorts resistor 526 and pulls down node B3, placing the driver in the low power mode.

In the low power mode transistor 518 drives outputs DRA, DRB at approximately one third full power, providing a boot-strap to the full power mode. Referring to FIG. 3, once driven at one third full power, output DRB moves away from GND, and the output BGZ of comparator 318a becomes different than the output ZGB of comparator 318b, i.e., DRB is either greater than or less than GND. As a result, the output BEZ of XNOR gate 320 changes from a logic 1 to a logic 0. Similarly, the output AEZ of XNOR gate 314 changes from a logic 1 to a logic 0. As shown in FIG. 2 and FIG. 8, when output AEZ changes from a logic 1 to a logic 0, the output $\overline{DAEZ}$ of the delay circuit 206 changes from a logic 0 to a logic 1, and the output $\overline{AEBEZ}$ of NAND gate 214 becomes logic 1. Referring again to FIG. 6, when $\overline{AEBEZ}$ becomes a logic 1 (and thus AEBEZ becomes a logic 0), the output of NOR gate 622 changes from a logic 1 to a logic 0 and FET 624 becomes non-conductive. Node B3 is thus no longer pulled down. Additionally, as shown in FIG. 2 and FIG. 9 the EN_DR signal changes from a logic 1 to a logic 0 when DAEB becomes a logic 0 in response to the outputs DRA, DRB being driven at one third full power. The driver thus reverts to the full power mode by first driving the outputs at one third full power. The typical transition time is approximately 100–500 nanoseconds.

Figure 6:
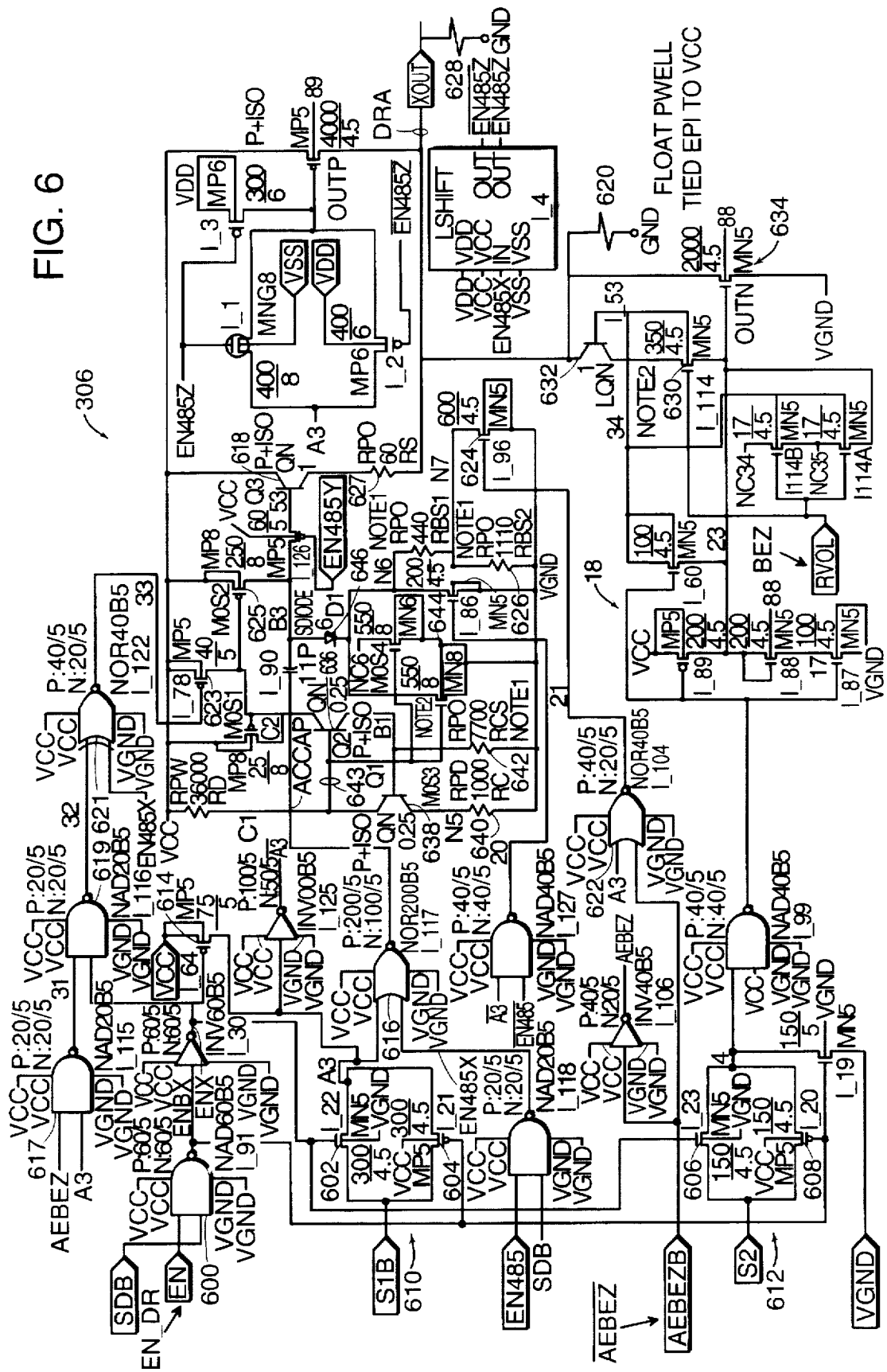

As shown in FIG. 6, internal driver 306 (FIG. 3) functions in a substantially similar manner to internal driver 304 (FIG. 3). The EN_DR signal is provided to a NAND gate 600, which provides output ENBX. ENBX and its inverted counterpart ENX control the gates of FETs 602, 604, 606, 608, and thus control transmission gates 610 and 612. In the full power mode, ENBX is at logic 0. When EN_DR becomes logic 0 in response to DRA=DRB≠GND, ENBX becomes logic 1 and the transmission gates are disabled. Further, ENX is connected to the gate of FET 614. When ENBX becomes logic 1, the output of NAND 619 becomes logic 1, the output of NOR 621 becomes logic 0, and FET 623 becomes conductive and causes FET 625 to become non-conductive, cutting off bipolar transistor 618.

When the outputs are no longer shorted, the driver reverts to full power mode after entering the low power mode. Following the OFF mode, the outputs DRA, DRB are pulled to GND by one or more poly-resistors 620, which are connected between DRA and GND. To provide the required 150 Ω impedance, the poly-resistors provide a total output to ground impedance of 300 Ω. By having 300 Ω poly-resistors in each internal driver, an equivalent 150 Ω impedance is presented when both outputs DRA, DRB are shorted together.

When the outputs are pulled to GND, the signal $\overline{AEBEZ}$ becomes logic 0. The $\overline{AEBEZ}$ signal is provided to NOR gate 622, causing FET 624 to be activated. Activating FET 624 effectively shorts resistor 626 and pulls down node B3, placing the internal driver in the low power mode. Once in the low power mode, transistor 618 drives output DRA at approximately one third full power and the AEBEZ signal changes state. When AEBEZ changes state, the driver returns to the full power mode.

Referring to both FIG. 5 and FIG. 6, the driver can be manufactured to provide either balanced or unbalanced differential outputs DRA, DRB. In the balanced arrangement, resistor 526 has a resistance value which is equal to that of resistor 626 and resistor 527 has a resistance value which is equal to that of resistor 627. In the unbalanced arrangement resistor 526 is not equal to resistor 626 and resistor 527 is not equal to resistor 627. For example, a 2260 Ω resistor 526, and a 1110 Ω resistor 626, along with a 100 Ω resistor 527 and 60 Ω resistor 627 will provide suitable unbalanced differential operation.

In an alternative embodiment a single 150 Ω poly-resistor 528 or 628 can be used in lieu of poly-resistors 520, 620. Poly-resistors 520, 620 provide a path to GND on each output DRA, DRB, 150 Ω being provided by parallel 300 Ω resistors. However, a single 150 Ω poly-resistor 528 or 628 will provide the requisite resistance value when the terminals are short-circuited since the internal resistances of non-conductive FETs 534, 634 are relatively high in comparison to single poly-resistor 528 or 628. The low power mode is not necessarily used for moving from the off mode to the full power mode in the single 150 Ω poly-resistor arrangement. When the short circuit condition is ceased, the output which is connected to ground potential through the poly-resistor will be pulled to ground and the other output will float. As such, the outputs will become unequal and the driver will return directly to the full power mode according to the control logic. There is however a possibility that the driver will enter the low power mode if the floating output is approximately at ground potential.

In another alternative embodiment additional circuitry may be included to avoid false triggering of the OFF and low power modes and assure source impedance equal to 50 Ω–150 Ω. Two possible methods can be employed to verify compliance with the V.35 source impedance requirement: a single-ended approach and a differential approach. The single-ended approach uses open-circuit voltage and short-circuit current. The differential approach uses open-circuit voltage and current through a load. Without additional circuitry, it is possible that false triggering will occur with the single-ended approach. Since the conditions specified by the single-ended approach may occur in normal operation, it may be desirable to include circuitry to avoid false triggering.

In the single-ended approach, before short-circuit current is measured one output terminal is at logic 0 and the other output terminal is at logic 1. The output with logic 1 is then brought down from logic 1 through logic 0 to GND. Given that:

$$Z_s(\Omega) = V_{oc}(\text{volts})/I_{sc}(A),\qquad \text{EQ. 1}$$

where $Z_s$ is the source impedance looking into the output terminal, $V_{oc}$ is the open-circuit (No load) voltage at the output terminal with respect to GND, and $I_{sc}$ is the short-circuit (output pad short to GND) current, there is an undesirable possibility that the driver will interpret both of the outputs as equal or at GND potential and incorrectly place the driver in the low power or the OFF mode. To avoid false triggering, the following logic is introduced:

IF DRA=logic 1 and DRB=logic 0
AND IF DRA is shorted to GND
THEN DRB is set to logic 0+100 mV.

Similarly,

IF DRB=logic 1 and DRA=logic 0
AND IF DRB is shorted to GND
THEN DRA is set to logic 0+100 mV.

When the above logic is used, AEBEZ and EN_DR are not falsely triggered since the output at logic 0 is at least 100 mV above GND when the other output is shorted to GND.

To illustrate implementation of the above logic, prior to a single-ended source impedance measurement DRA may be at logic 1 and DRB at logic 0. Referring to FIG. 5, input RVOL receives AEZ. When DRA is shorted to GND, RVOL becomes logic 1 and activates FET 530, setting DRB to logic 0+100 mV through bipolar transistor 532 and FET 532 (transistor 532 and FET 530 provide a 0.1 V when conductive). As shown in FIG. 6, where input RVOL receives BEZ; internal driver 306 functions in a substantially similar manner.

The V.35 source impedance specifications can also be met with the differential driver configuration and a differential approach using open circuit voltage and current through the load to determine source impedance. According to this method:

$$Z_s(\Omega) = |(V_{oc}(\text{volts}) - V_{LOAD}(\text{volts}))/| V_{LOAD}(\text{volts})/R_{LOAD}(\Omega)|$$

where $Z_s$ is the source impedance across the outputs, $V_{oc}$ is the open circuit (no-load) voltage across the outputs, $V_{LOAD}$ is the voltage across the loaded outputs, and $R_{LOAD}$ is the load (100 Ω) across the outputs.

According to this method, two voltage measurements are needed: $V_{oc}$ and $V_{LOAD}$. False triggering does not present a problem since both $V_{oc}$ and $V_{LOAD}$ can be measured during open-circuit and normal operation.

Referring to FIG. 5, the driver circuits include compensation for temperature variation. In order to address temperature variation, temperature compensation for the drive voltage output is provided with bipolar transistors 536, 538 and resistors 540, 542. The base of bipolar transistor 536, the collector of bipolar transistor 538 and the gate of FET 544 are connected to node 543. The emitter of bipolar transistor 538 is connected to ground through resistor 540. The emitter of bipolar transistor 536 is connected to the base of bipolar transistor 538, and to ground through resistor 542. The transistors 536, 538 have negative base-emitter voltage ($V_{BE}$) temperature coefficients. The resistors 540, 542 have a resistance value which increases as temperature increases, and are used to generate a voltage with a positive temperature coefficient which is approximately equal to the $V_{BE}$ negative coefficient. A temperature compensated reference voltage is thus generated at node 543. FET 544 and diode 546 provide a path from node B3 to ground, and thus exert control over transistor 518 and the output voltage DRB. The temperature compensating reference voltage at node 543 is applied to the gate of FET 544, which becomes more or less conductive in response thereto and hence provides temperature compensation.

The driver circuits also include circuitry which compensates for voltage source variations. As the VCC supply voltage increases, such produces an increased current through diode 546. Absent compensation, this increased current would result in increased drive voltage at node B3. To compensate for an increase in the supply voltage, the voltage at the gate of the FET 544 is biased so as to increase with increasing $V_{cc}$ and thereby cause FET 544 to increase conduction. Thus, the equivalent resistance from the cathode of the diode to GND remains substantially constant and the drive voltage remains substantially constant. Similarly, the circuit compensates for decreases in the $V_{cc}$ supply voltage.

It should be understood that various changes and modifications may be made from the embodiment herein disclosed. Accordingly, the invention is not to be viewed as limited except by the scope and spirit of the appended claims.

What is claimed is:

1. A serial interface driver for driving a serial communications interface comprising:
   interface drive circuitry having first and second outputs and at least one control input, said interface drive circuitry capable of operating in a disabled mode in which first and second outputs are disabled, a full power mode and low power mode in which said outputs are capable of driving said serial communications interface at less than full power; and
   an interface drive circuit controller wherein:
      said interface drive circuit controller is operative to activate said at least one control input to cause said drive circuitry to operate in said disabled mode upon sensing that said first output is at the same potential as said second output and both the first and second outputs are not at a fixed reference potential;
      said interface drive circuit controller is operative to activate said at least one control input to cause said drive circuitry to operate in said low power mode upon sensing that said first and second outputs are both approximately equal and at said fixed reference potential; and
      said interface drive circuit controller is operative to activate said at least one control input to cause said drive circuitry to enter said full power mode following said low power mode upon sensing that said first output is not equal to said second output.

2. The serial interface driver of claim 1 wherein said interface drive circuitry and said interface drive circuit controller are fabricated on a single integrated circuit.

3. The serial interface driver of claim 1 wherein the power provided to said outputs in said low power mode is approximately one third the power provided to said outputs in said full power mode.

4. The serial interface driver of claim 1 further comprising first and second resistors coupled respectively between said first and second outputs and said fixed reference potential.

5. The serial interface driver of claim 4 wherein said fixed reference potential is ground.

6. The serial interface driver of claim 4 wherein said first and second resistors are fabricated as polysilicon resistors.

7. The serial interface driver of claim 4 wherein said first and second resistors each have a resistance of approximately 300 Ω.

8. The serial interface driver of claim 1 wherein at least one of said outputs is coupled to ground through a resistive network having an equivalent resistance of approximately 150 Ω.

9. The serial interface driver of claim 8 wherein one of said first and second outputs is not coupled to ground and said driver sometimes moves directly from said disabled mode to said full power mode without entering said low power mode.

10. The serial interface driver of claim 4 wherein said driver includes false trigger avoidance logic,
    said false trigger avoidance logic being operative to set the second output to a logic 0 plus a first predetermined voltage offset IF the first output is a logic 1 and the second output is a logic 0, AND IF the first output is shorted to ground potential; and
    said false trigger avoidance logic being operative to set the first output to a logic 0 plus a second predetermined voltage offset IF the second output is a logic 1 and the first output is a logic 0, AND IF the second output is shorted to ground potential.

11. The serial interface drive of claim 1 wherein said first and second outputs comprise balanced differential outputs.

12. The serial interface driver of claim 1 wherein said first and second outputs are unbalanced differential outputs.

13. The serial interface driver of claim 1 further including a temperature compensation circuit having at least one transistor with a negative temperature coefficient and at least one resistor connected to said first transistor and having a positive temperature coefficient approximately equal in magnitude to the temperature coefficient of said first transistor such that a resultant voltage drop across $V_{BE}$ of said first transistor and said at least one resistor has a temperature coefficient of approximately zero.

14. The serial interface driver of claim I further including a FET providing a variably conductive pathway between a supply voltage and a voltage potential, said FET having a gate which is biased relative to the supply voltage such that said FET increases conduction as the supply voltage increases, and decreases conduction as the supply voltage decreases.

15. A differential driver for driving a serial communications link comprising:
    a driving circuit with first and second outputs; and
    logic circuitry operative:
       to disable said first and second outputs upon sensing that said first and second outputs are at the same potential and not at ground potential;
       to cause said first and second outputs to drive said communications link in a low power mode upon sensing that said first and second outputs are both approximately at ground potential; and
       to cause said first and second outputs to drive said communications link in a full power mode upon sensing that said first output is at a different potential from said second output.

16. The driver of claim 15 further including a comparator circuit operative to provide an intermediate signal which indicates that the first output is at ground potential.

17. The driver of claim 15 further including a comparator circuit operative to provide an intermediate signal which indicates that the first output and the second output are at the same potential.

18. The driver of claim 15 further including a driver control circuit operative to provide a driver enable signal which indicates that the first and second outputs are both approximately at ground potential.

19. The driver of claim 15 wherein said first and second outputs of said driver apply approximately three times the power to said communications link in said full power mode as in said low power mode.

20. The driver of claim 15 further comprising first and second resistors coupled respectively between said first and second outputs and ground potential.

21. The driver of claim 20 wherein said first and second resistors each have a resistance of approximately 300 Ω.

22. The driver of claim 15 wherein at least one of said outputs is coupled to ground through a resistive network having an equivalent resistance of approximately 150 Ω.

23. The differential driver of claim 22 wherein one of said first and second outputs is not coupled to ground and said driver sometimes moves directly from said disabled mode to said full power mode without entering said low power mode.

24. The driver of claim 15 wherein said driver includes false trigger avoidance logic:
said false trigger avoidance logic being operative to set the second output to a logic 0 plus a first predetermined voltage offset IF the first output is a logic 1 and the second output is a logic 0, AND IF the first output is approximately at ground potential; and
said false trigger avoidance logic being operative to set the first output to a logic 0 plus a second predetermined voltage offset IF the second output is a logic 1 and the first output is a logic 0, AND IF the second output is approximately at ground potential.

25. The driver of claim 15 wherein said first and second outputs comprise balanced differential outputs.

26. The driver of claim 15 wherein said first and second outputs are unbalanced differential outputs.

27. The serial interface driver of claim 15 further including a temperature compensation circuit having at least one transistor with a negative temperature coefficient and at least one resistor connected to said first transistor and having a positive temperature coefficient approximately equal in magnitude to the temperature coefficient of said first transistor such that a resultant voltage drop across $V_{BE}$ of said first transistor and said at least one resistor has a temperature coefficient of approximately zero.

28. The serial interface driver of claim 15 further including a FET providing a variably conductive pathway between a supply voltage and a voltage potential, said FET having a gate which is biased relative to the supply voltage such that said FET increases conduction as the supply voltage increases, and decreases conduction as the supply voltage decreases.

29. A method for detecting the presence of a short circuit across first and second output terminals of a driver for a serial communications link and recovering therefrom in the absence of said short circuit comprising the steps of:
disabling said driver outputs upon sensing that the first output terminal of said driver is at the same voltage potential as the second output terminal of said driver and that said first and second outputs are not equal to a fixed reference potential; and
in an enabling step, enabling said driver outputs to drive said serial communications interface at full power upon sensing that the voltage of said first output terminal differs from the voltage of said second output terminal.

30. The method of claim 29 including an intermediate enabling step following said disabling step, said intermediate enabling step including enabling said driver outputs to drive said serial communications interface in a low power mode upon sensing that said first and second output terminals are both approximately at the fixed reference potential.

31. The method of claim 30 further including the step of pulling the first and second outputs to the fixed reference potential following cessation of the short-circuit condition via first and second resistors coupled between each respective output and the fixed reference.

32. The method of claim 29 wherein said driver drives said communications link at approximately three times the power in said second enabling step as in said first enabling step.

* * * * *

UNITED STATES PATENT AND TRADEMARK OFFICE
CERTIFICATE OF CORRECTION

PATENT NO.   : 5,789,943
DATED        : August 4, 1998
INVENTOR(S)  : Wong et al.

It is certified that error appears in the above-identified patent and that said Letters Patent is hereby corrected as shown below:

Column 12, claim 31, fifth line, after "fixed reference", insert --potential--:

Signed and Sealed this

First Day of December, 1998

*Attest:*

*Attesting Officer*

BRUCE LEHMAN

*Commissioner of Patents and Trademarks*